(12) United States Patent
Wojtiuk (10) Patent No.: US 8,031,028 B2
(45) Date of Patent: *Oct. 4, 2011

(54) POLAR SIGNAL PROCESSOR TO DRIVE A SEGMENTED POWER AMPLIFIER AND METHOD THEREFORE

(75) Inventor: Jeffrey Wojtiuk, Willingham (GB)

(73) Assignee: SiGe Semiconductor (Europe) Ltd., Hertfordshire (GB)

( * ) Notice: Subject to any disclaimer, the term of this patent is extended or adjusted under 35 U.S.C. 154(b) by 1368 days.

This patent is subject to a terminal disclaimer.

(21) Appl. No.: 10/969,866

(22) Filed: Oct. 22, 2004

(65) Prior Publication Data

US 2006/0018375 A1  Jan. 26, 2006

Related U.S. Application Data (60) Provisional application No. 60/585,601, filed on Jul. 7, 2004.

(51) Int. Cl.
*H04L 27/20* (2006.01)

(52) U.S. Cl. ........ 332/103; 332/145; 332/146; 332/151; 332/152; 375/308

(58) Field of Classification Search ............. 332/103, 332/145, 146, 151, 152; 375/297, 298, 302, 375/308, 320, 323
See application file for complete search history.

(56) References Cited

U.S. PATENT DOCUMENTS

| | | | |
|---|---|---|---|
| 4,485,357 A | | 11/1984 | Voorman |
| 4,580,111 A | * | 4/1986 | Swanson ............... 332/152 |
| 7,072,626 B2 | * | 7/2006 | Hadjichristos ............. 455/126 |
| 7,657,238 B2 | * | 2/2010 | Grange ............... 455/127.1 |
| 2004/0038648 A1 | | 2/2004 | Matsuura et al. |
| 2005/0286652 A1 | * | 12/2005 | MacPhail et al. ............. 375/297 |

FOREIGN PATENT DOCUMENTS

| | | |
|---|---|---|
| WO | WO 00/21191 | 4/2000 |
| WO | WO 02/47249 A2 | 6/2002 |
| WO | WO 2005/020430 A2 | 3/2005 |

* cited by examiner

*Primary Examiner* — Levi Gannon
(74) *Attorney, Agent, or Firm* — Morris & Kamlay LLP (57) ABSTRACT

A circuit for providing AM/PM modulation is described. The circuit provides two drive signals which are later combined in a constructive/destructive fashion. The circuit provides AM modulation with a drive signal having a consistent power level modulated to have varying pulse widths in order to provide variable power within each cycle.

59 Claims, 7 Drawing Sheets

POLAR SIGNAL PROCESSOR TO DRIVE A SEGMENTED POWER AMPLIFIER AND METHOD THEREFORE

This application claims the benefit of U.S. Provisional Application No. 60/585,601, filed Jul. 7, 2004.

FIELD OF THE INVENTION

The invention relates to the field of transmit signal generators and more specifically to the field of transmit signal generators for generating signal power levels that are comparable to those of existing power amplifiers for use in wireless terminals and peripherals including cellular telephone and wireless LANs.

BACKGROUND OF THE INVENTION

One class of power amplifiers that is known to perform with high efficiency are those that operate in a saturation mode. Efficiency being defined as the ratio of power emitted, in the form of radio frequency signal, to the electrical power used by the amplifier in order to produce said radio frequency signal. In many communication systems using frequency modulation (e.g. FSK), amplifiers are operated at or near their most efficient point of operation since minimal amplitude variation in the output signal occurs. Unfortunately, as demand grows for increased transmitted data bandwidth within each transmission channel, amplitude modulation is introduced into transmitted signals. With both frequency and amplitude modulation, distortion impairing data transmission rates becomes a more important figure of merit in respect of power amplifier performance. First, varying the signal power causes efficiency variations with which a varying output power signal is amplified. Second, because there is amplitude modulation, any variation in the ratio between input amplitude and output amplitude of a PA results in distortion, known to create data transmission errors more likely. Furthermore, is can be appreciated that there are legislative requirements that govern how much signal power is allowed within adjacent transmission channels in a wireless communication system. Signal power in adjacent transmission channels can arise with increasing distortion applied to the original signal submitted for amplification.

It is desirable to produce an amplitude varying transmit signal in an efficient fashion thereby preserving power and, in the context of battery powered terminals, maximizing the time interval between terminal charging. Typically, most transmitter applications utilize linear amplifiers that are transmitting at a power level considerably reduced from the power level at which the amplifier saturates. This reduction is often called the back-off. For example, a PA might be designed and biased to supply 30 dBm of amplification at the point of gain compression (1 dB compression point) but is operated 6 dBm below that power level so that the power amplifier is a regime of operation where the gain is relatively invariant. Clearly, if the gain is invariant then distortion arising from amplitude modulation is minimized. While distortion performance is thereby improved, efficiency is compromised since the amplifier is still biased for operation at a much higher level of output power. Thus a need exists to amplify an amplitude-varying signal for transmission in a more efficient manner.

One known method of increasing the efficiency in such an amplifier is by increasing the control circuitry complexity to vary more amplifier parameters in order to maintain near optimal efficiency for any and all amplification requirements. The disadvantage of such a scheme is that if the control system for controlling the PA is too complicated then it might consume more power than it recovers through efficiency. Moreover, additional control circuitry will commensurately increase the size of circuit board or, in the context of monolithic integration, the semiconductor die area. It is also well appreciated by the semiconductor power amplifier designers that power amplifier control schemes can lead to problems with the stability of the amplifier. Often an amplifier using a control loop will oscillate at some frequencies. Generally speaking, control systems for controlling various operation parameters of the power amplifier will add cost and, as the complexity of the control circuit increases, the power savings diminish.

Another known approach utilizes a plurality of PAs driven in parallel wherein the phase of the input signal provided to each of the PAs is controlled. A power combiner is coupled to the output ports of each of the PAs to combine output signals therefrom using a vector sum. Under this scheme, amplitude modulation is provided by controlling the phase angle of the input. However, efficiency of such an amplifier is often impaired by losses in the combiner circuit and therefore output power is wasted even though in principle each PA is operated close to the saturated output power level.

In typical transmitter systems, transmitter signal generators generate a modulated signal at a known carrier frequency for transmission at a known power level using two separate circuits, a modulation circuit and a power amplifier circuit (PA). The modulation circuit is for generating of a modulated signal, or RF signal, and then the PA is used to amplify the modulated signal to the known power level. Typically it is the PA that consumes a majority of power for the signal generator and, as such, PA efficiency is of significant concern. The PA circuit is typically implemented using any of a number of different transistor manufacturing technologies, such as GaAs, Si bipolar, SiGe bipolar, LDMOS and CMOS FET. Though the CMOS FET technology enables implementation of reasonable nonlinear PA circuits, it has yet to demonstrate efficiency when used for implementing of linear power amplifier circuits. The GaAs, SiGe and Si bipolar devices produce excellent linear PAs, but they are not always available as device options combined with a state-of-the-art CMOS process. Moreover, conventional CMOS technology remains one of the most cost effective semiconductor electronics technology platforms available today. It is available from a number of foundry suppliers, particularity to satisfy the market for digital CMOS circuits that are extensively utilized in modern telecommunication and computing systems.

GaAs and other group III-V materials have yet to be integrated into a high density CMOS process so that a single chip solution incorporating both the signal processing elements, primarily digital in nature, and amplifying elements are not yet practical. Rather, one often finds systems implemented using a mix of semiconductor technology elements. Unfortunately, state of the art CMOS linear power amplifiers do not have high efficiency operation, primarily due to the CMOS transistor saturation voltage. This drawback, inherent to known architectural approaches for a linear amplifier, prevents linear CMOS PAs from being accepted in the market for many common RF applications because they result in significantly reduced battery life for portable devices.

On the other hand, a non-linear architecture using CMOS switch-class PAs, can operate with constant amplitude envelope signals quite efficiently for some applications. Unfortunately, CMOS transistors operating in a switched mode, do not have effective power control much less sufficient dynamic range in said power control for CDMA applications or other modulation scheme wherein amplitude control is an important part of the signal transmission scheme. One known way of achieving power control in the context of a switch class CMOS PA, is by reducing the drain to source terminal voltage (Vds) for the FET therein. This reduction in Vds can provide approximately 30 dB of power control. Unfortunately, it is known to those skilled-in-the-art that CDMA and WCDMA applications require in excess of 60 dB power control.

For efficient operation in transmitter circuits, polar transmitter circuits can be utilized, where the amplitude modulation is applied directly to the PA through collector/drain voltage control and or bias control. Primarily this approach relies on predictable amplitude and phase response through the PA over a wide range of output signal powers. Alternatively, this approach relies on amplitude and phase compensation circuits being used to compensate for imperfections. Unfortunately, it is well appreciated by those skilled-in-the-art that the known compensation circuits consume power and increase the cost of the transmitter. Furthermore, there is significant demand to integrate signal generator circuits into a single IC, which is difficult with the above architectures.

It is conceivable that a PA circuit could be integrated with the modulation circuit using a SiGe technology, but this has yet to be achieved in a market acceptable form and is considered difficult with CMOS devices. A need therefore exists to integrate the signal generator including the modulation circuit and the PA circuit in a single semiconductor die using a CMOS process. This allows for the benefit of advances in CMOS process technology and reduced costs due to high volume for CMOS wafers.

It is therefore an object of the invention to provide a relatively efficient and relatively linear CMOS power amplifier that can be integrated with a modulation circuit to form a complete integrated signal generator circuit.

SUMMARY OF THE INVENTION

It is an object of the invention to provide a signal converter for providing at least a signal to a segmented switching PA enabling high efficiency operation with OFDM, WCDMA and EDGE signals.

It is an object of the invention to provide a signal converter for providing at least a signal to a segmented switching PA that provides accurate AM and power control relying on switches operated in a substantially digital manner.

It is an object of the invention to provide a signal converter for providing at least a signal to a segmented switching PA that provides a strategic path for future all-CMOS multimode radio integration.

In accordance with the invention there is provided a method of generating a modulated RF carrier signal comprising: receiving at least an information signal having information therein relating to an amplitude modulation for the RF carrier signal; providing a first digital signal; and, providing a second other digital signal having a phase relationship with the first digital signal relating to the amplitude modulation in accordance with the at least an information signal.

In accordance with the invention there is provided a modulation circuit comprising: at least an input port for receiving at least an information signal having information therein relating to AM modulation; a signal converter for providing a first digital signal relating to the at least an information signal and for providing a second digital signal relating to the at least an information signal and for being combined with the first digital signal, the first digital signal and the second digital signal phase modulated relative to the other; and, a summing circuit for summing the first digital signal and the second digital signal to produce a digital drive signal for, when applied to a load, resulting in an amplitude modulated signal.

In accordance with the invention there is provided a modulation circuit comprising: at least an input port for receiving at least an information signal having information therein relating to AM modulation; and, an AM modulator circuit for amplitude modulating of the information within a carrier signal, the amplitude modulation performed with a digital drive signal having two states, the amplitude modulation a result of pulse widths within the digital drive signal.

In accordance with the invention there is provided a storage medium having stored therein data, the data for when executed resulting in the steps of: receiving at least an information signal having information therein relating to an amplitude modulation for the RF carrier signal; providing a first digital signal; and, providing a second other digital signal having a phase relationship with the first digital signal relating to the amplitude modulation in accordance with the at least an information signal.

In accordance with the invention there is provided a method of generating a modulated RF carrier signal comprising: receiving at least an information signal having information therein relating to a phase modulation for the RF carrier signal; providing a first digital signal; providing a second other digital signal having a phase relationship with the first digital signal relating to the phase modulation in accordance with the at least an information signal.

In accordance with the invention there is provided a modulation circuit comprising: at least an input port for receiving at least an information signal having information therein relating to phase modulation; a signal converter for providing a first digital signal relating to the at least an information signal and for providing a second digital signal relating to the at least an information signal and for being combined with the first digital signal, the first digital signal and the second digital signal phase modulated relative to the other; and, a summing circuit for summing the first digital signal and the second digital signal to produce a digital drive signal for, when applied to a load, resulting in a phase modulated signal.

In accordance with the invention there is provided a storage medium having stored therein data, the data for when executed resulting in the steps of: receiving at least an information signal having information therein relating to a phase modulation for the RF carrier signal; providing a first digital signal; providing a second other digital signal having a phase relationship with the first digital signal relating to the phase modulation in accordance with the at least an information signal.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
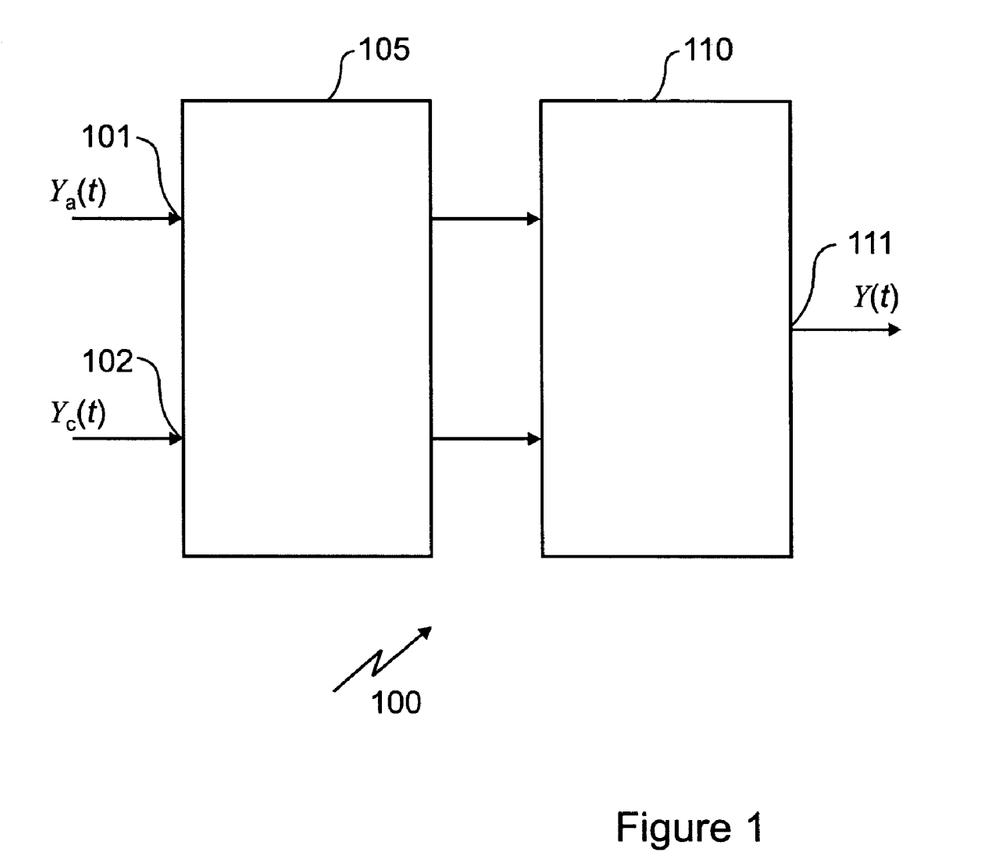
FIG. 1 illustrates a power amplifier (PA) output stage circuit in the form of a LINC PA and combiner circuit.

Referring to FIG. 1, a signal converter and combiner circuit 100 is shown. The circuit receives a first input signal $y_a(t)$ at first input port 101 and a second input signal $y_c(t)$ at second input port 102. The two signals are converted in signal converter 105 and provided to combiner 110. From the combiner is provided an output drive signal y(t) from output port 111. The present invention relates to the implementation and function of the signal converter for providing at least a signal for use in amplitude modulation.

Figure 2A:
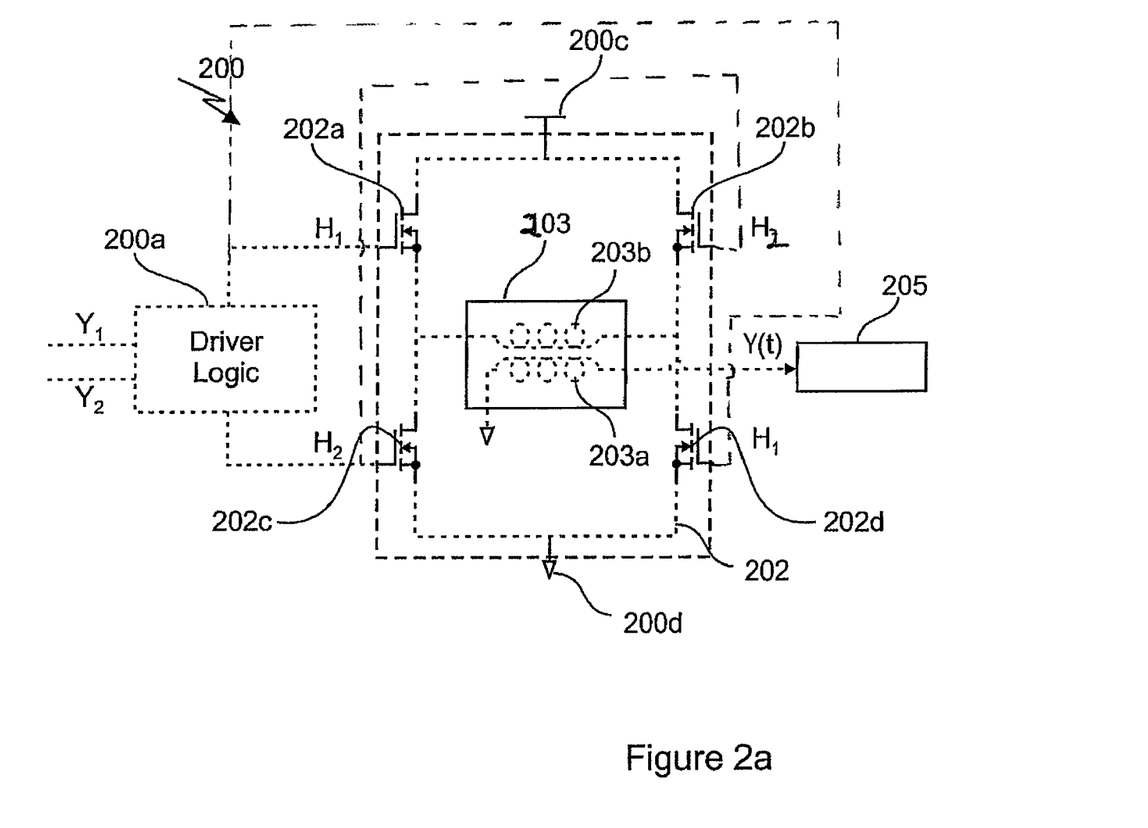
FIG. 2A illustrates a power amplifier (PA) output stage circuit in the form of a LINC PA and combiner circuit having an H-Bridge architecture.

FIG. 2A illustrates a power amplifier (PA) output stage 200. The output stage 200 is primarily in the form of an H-bridge 202 that is disposed between first and second supply voltage ports, 200c and 200d. The H-bridge circuit 202 is primarily formed from two circuit branches. A first circuit branch has a first end thereof coupled with the first supply voltage port 200c, where a first side of a first high side switching circuit 202a is coupled thereto. Coupled to the second side of the first high side switching circuit 202a is a first end of a primary winding 203b of a transformer 203. Coupled to the second end of the primary winding 203b is a second low side switching circuit 202d, which is further coupled with the second supply voltage port 200d, terminating the first circuit branch. A second circuit branch has a first end thereof coupled with the first supply voltage port 200c, where a first side of a second high side switching circuit 202b is coupled thereto. Coupled to the second side of the second high side switching circuit 202b is a second end of the primary winding 203b of the transformer 203. Coupled to the first end of the primary winding 203b is a first low side switching circuit 202c, which is further coupled with the second supply voltage port 200d, terminating the second circuit branch. Thus, the first and second circuit branches cross in the center of the H-bridge along the primary winding 203b. A secondary winding 203a for the transformer 203 is coupled with a load 205. In this case, the transformer 203 is absent a center tap.

A PA output stage input port 200a is coupled with the first high side switching circuit 202a and the second low side switching circuit 202d for controlling the switching operation thereof. The PA output stage input port 200a is coupled with the second high side switching circuit 202b and the first low side switching circuit 202c via a second port thereof for controlling the switching operation thereof. The H-bridge circuit therefore allows for controlling the polarity of the signals that propagate through the primary winding 203b of the transformer 203.

A power amplifier circuit is preferably connected to the output stage input port 200a for providing a signal thereto for producing a single-ended output to the load 205. Preferably the switching circuits, 202a through 202d, are in the form of MOS devices that are hard switched to reduce current losses. Further preferably, complementary devices are used to increase voltage swing at the output port 200b, while reducing the voltage across each of the MOS devices. Driving a floating load 205 with a differential signal is a common technique for increasing the signal amplitude across the load 205. The transformer 203 converts the differential signal into a single ended signal for provision to the load 205.

Connecting the primary winding of the transformer across the power supply, through the use of the switching circuits 202a through 202d, and alternating the polarity of the connection, the current flow through the primary winding is limited by the inductance of the transformer, and the losses across the switching circuits, 202a through 202d, are reducible. This results in an efficient generation of a carrier signal suitable for constant-envelope signals. Further, the signal thereby produced has three possible potentials, neutral, positive or negative, depending on the signals H1 and H2.

Figure 2B:
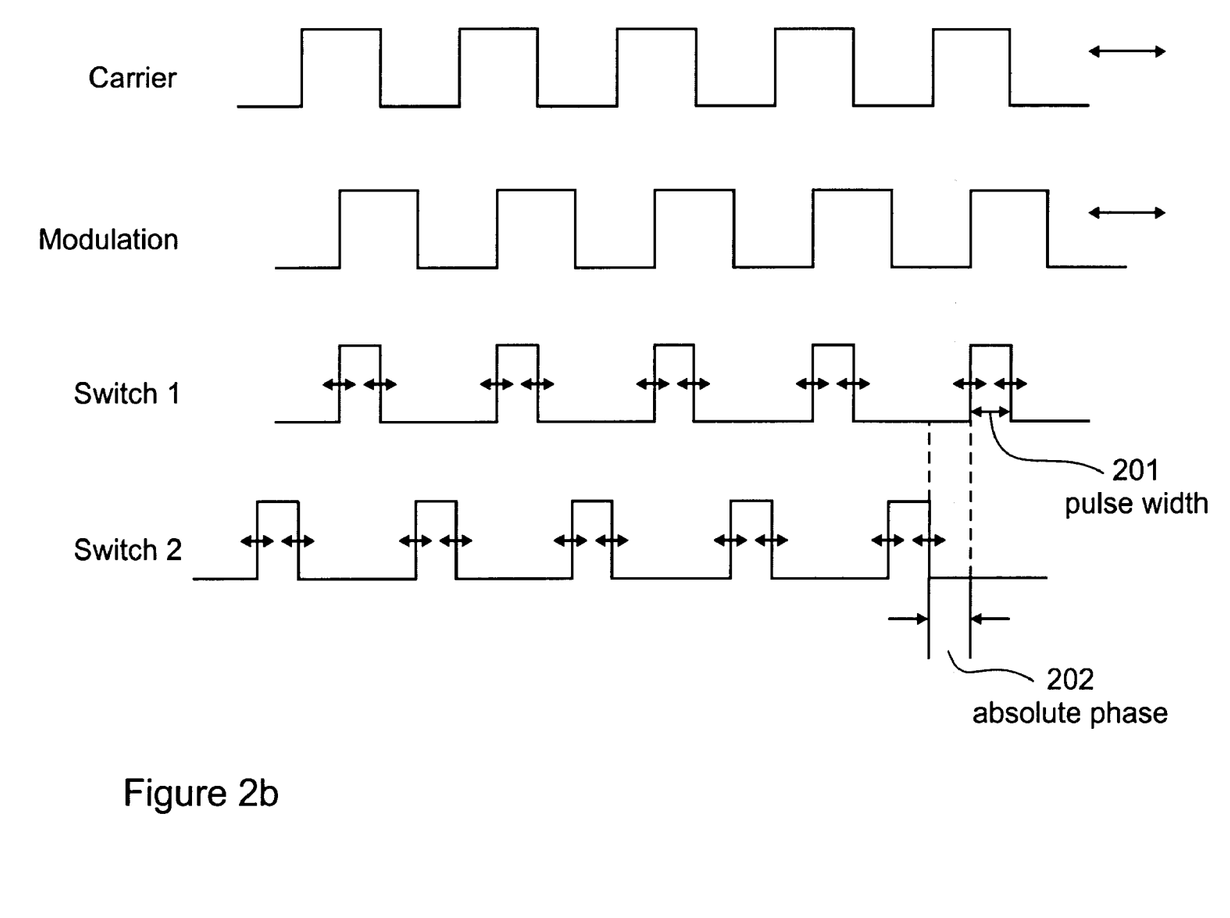
FIG. 2B illustrates a graphical representation of two signals, 'Carrier' and 'Modulation', which are digital signals that oscillate between a high state and a low state, the two signals being phase shifted one relative to the other.

FIG. 2B illustrates two signals, 'Carrier' and 'Modulation', which are digital signals that oscillate between high and low. Signal "Switch 1" results when the signals Carrier and Modulation are both high and signal "Switch 2" results when both signals Carrier and Modulation are both low. Signals "Switch 1" and "Switch 2" are those signals that are actually applied to each of the switching circuits, such as those described in the embodiments of the invention, hereinbelow. The generated signals Switch 1 and Switch 2 each have a pulse width 201 and an absolute phase 202, as shown.

Figure 3A:
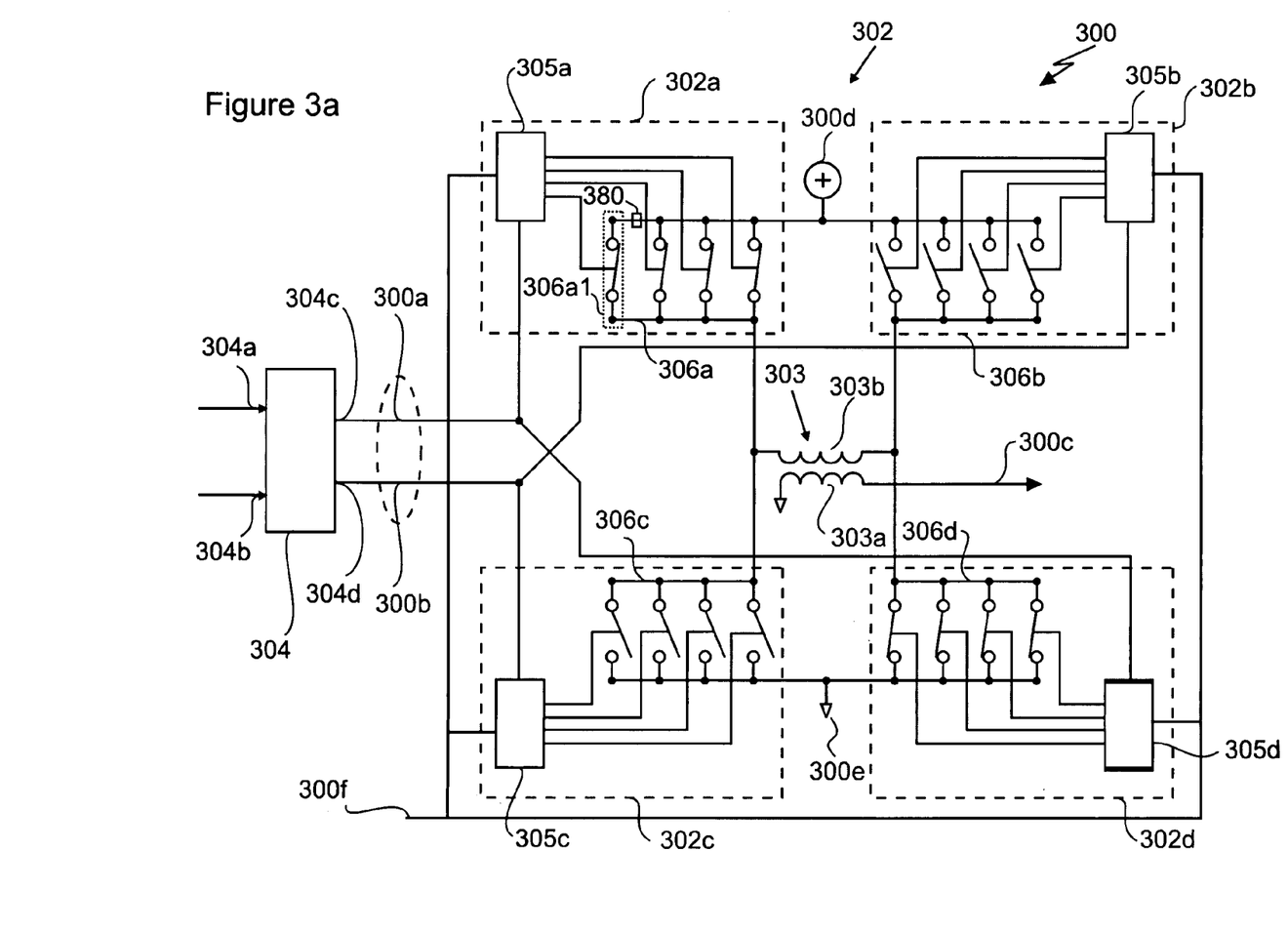
FIG. 3A illustrates a differential amplifier according to an embodiment of the invention.

FIG. 3A illustrates a differential amplifier 300 according to an embodiment of the invention for use in a signal generator circuit for generating a modulated signal at a known carrier frequency. An output stage 302 is provided in the form of a H-bridge that is disposed between first and second supply voltage ports, 300d and 300e. The H-bridge circuit 302 is formed from two circuit branches. A first circuit branch has a first end thereof coupled with the first supply voltage port 300d, where a first side of a first high side driver circuit 302a is coupled thereto. Coupled to the second side of the first high side driver circuit 302a is a first end of a primary winding 303b of a transformer 303. Coupled to the second end of the primary winding 303b is a second low side driver circuit 302d, which is further coupled with the second supply voltage port 300e, terminating the first circuit branch. A second circuit branch has a first end thereof coupled with the first supply voltage port 300d, where a first side of a second high side driver circuit 302b is coupled thereto. Coupled to the second side of the second high side driver circuit 302b is a second end of the primary winding 303b of a transformer 303. Coupled to the first end of the primary winding 303b is a first low side driver circuit 302c, which is further coupled with the second supply voltage port 300e, terminating the second circuit branch. Thus, the first and second circuit branches cross in the center of the H-bridge along the primary winding 303b. A secondary winding 303a of the transformer 303 is coupled with an external load (not shown) and used for providing of a high power modulated RF signal thereto.

The transmitter output stage 300 is provided with a first input port 300a and a second input port 300b. The first input port 300a is coupled with the first high side driver 302a and with the second low side driver 302d and the second input port 300b is coupled with the second high side driver 302b and the first low side driver 302c. Within each of the drivers, 302a through 302d, switching circuits, 306a through 306d, as well as power control circuits, in the form of switching circuits 305a through 305d, are disposed, respectively. Switching circuits 306a are disposed between the first supply voltage port 300d and the first end of the primary winding 303b. Switching circuits 306b are disposed between the first supply voltage port 300d and the second end of the primary winding 303b. Switching circuits 306c are disposed between the second supply voltage port 300e and the first end of the primary winding 303b and switching circuits 306d are disposed between the second supply voltage port 300e and the second end of the primary winding 303b. Signal path delays within the signal-processing block 304 are approximately the same for the generation of the first and second output signals.

Each of the switching circuits is comprised of an array of binary-scaled switches, where each switch from the array is disposed between a supply voltage port and one of the ends of the primary winding 303b. The power control circuit 305a, 305b, 305c and 305d, found in each high side driver, 302a and 302b, and low side driver, 302c and 302d, is coupled with a same control port for receiving a power control signal for controlling the switching operation of each of the binary-scaled switches. The power control signal is in the form of a digital power control signal and is provided through a power control port 300f that is coupled with each of the power control circuits, 305a through 305d. This digital power control signal is used for gating the first and second digital signals that are provided to the output stage 302. Each array of the binary-scaled switches thus controls the current level provided to the transformer 303 via one or more of the array of digitally selectable power flow paths. This gating determines the power level that is transmittable using the transmitter 300.

The binary scaling of the switches determines the current that each of switches from, each array propagates, when closed. So for example, if there are four switches within each switching circuit, the switches are weighted in such a manner that the most significant bit enables opening and closing of the fourth switch and a least significant bit enables opening and closing of the first switch. When the fourth switch is closed it propagates eight times more current than the first switch, when closed. The third switch propagates four times more current than the first switch and the second switch propagates twice as much current as the first switch. The digital control signal is used for controlling each of the switches. For the four switches, a four bit digital value is used to control the operation thereof providing 16 switchably selectable different current levels. Of course, four switches is only an example and of course any number of switches are optionally implemented in order to meet the power requirements of the transmitter 300. Preferably each of the switches are MOS devices where an amount of current that each switch propagates when closed is determined by an area of the MOS device(s) that forms the switch. The power control circuits, 305a through 305d, are used to adjust the RF output signal power for transmission. Typically, this adjustment is performed at relatively slow and infrequent transitions, though it is feasible to use this for signal modulation. Potentially, when the power control circuits 305a through 305d are used for signal modulation, small amplitude steps result in additional amplitude modulation noise in the RF output signal. This additional noise can be compensated for either with pre-compensation or post-compensation based on a control circuit. Optionally, a smallest transistor 306a1 within a group of transistors (for example 306a) is controllable in an analogue fashion for providing precise power control.

A signal processing circuit 304 is used for providing of first and second digital signals to the first and second output stage input ports 300a, 300b using first and second output ports, 304c and 304d, coupled thereto. First and second input ports, 304a and 304b, of the signal-processing block 304 are used for receiving of a carrier signal and a modulation signal from an external source (not shown). Alternatively, the input to the signal processing circuit consists of one port for receiving a signal that contains the information required for the signal processing circuit to generate at least an appropriate output signal. Within the signal-processing block 304, circuitry processes the carrier and modulation signals to form the first and second digital signals that are phase shifted relative to each other for controlling a conduction angle for the output stage 302. A relative phase between these first and second output signals determines the amplitude for the RF output signal and the absolute phase determines the phase modulation. The amplitude modulation is applied to the RF output signal by controlling the relative phasing of the first and second digital signals and thus generates smoother amplitude transitions, which results in a cleaner transmit spectrum.

Advantageously, the transmitter circuit 300 allows for controlling of the RF output signal power without adjusting the biasing of the signal generating circuit. Instead, amplitude and phase modulation is controlled by a pulse width modulator circuit that is controlled using time alignment circuits implemented in, for example, a digital technology. The resulting control signals are summed in a constructive/destructive fashion across the transformer to result in the pulse width modulated signal. This approach provides greater repeatability and reliability than the analog control techniques. Alternatively, amplitude modulation is controlled by both phase modulation and by varying the current levels through the transformer. Once the pulse width modulated signal is generated, it is optionally filtered using a filter circuit to produce an amplitude modulated signal at the known carrier frequency. Alternatively, filtering is a result of characteristics of a load in the form of a radiator for radiating the signal. Alternatively, the load is in the form of a cable for conducting the signal.

Signal processing within the signal processing circuit 304 is used to create the first digital signal and the second digital signal that are provided to the output stage 302. Optionally, switches within each array of binary-scaled switches are turned on and off in a predetermined manner in relation to time to create a predetermined power profile. The turn-on and turn-off profile of the switches is relates to the ramp on or the ramp off for the PA (terms used in cellular communication). Peak power at any time is determined by a number of switches that are turned on within each switch array and the amplitude modulation for the output stage is determined by the phasing between the first and second digital signals that are provided to the output stage 302.

The transmitter circuit 300 above enables the amplitude modulation of the output signal by using pulse width modulation, through the control of the phase of the first and second digital signals, where the output stage 302 combines the two digital signals without the need for an independent combiner circuit. Through the use of a plurality of switching circuits, which are individually switchably selectable, a segmented output architecture is provided that enables RF output signal power control through selecting a number of switching elements that are to be switched. Within the output stage 302 the digital signals are combined without the use of a separate power combiner. Optionally, an attenuator circuit 380 is used in conjunction with the smallest current switching circuit 306a1 to extend the power control range for the transmitter 300. Such an attenuator can be used for attenuating the current provided from a group of transistors 306a by an amount less than the current provided by the smallest transistor 306a1 within the group 306a, which provides analogue control over the output power. Further optionally, output signal power control is also used for amplitude modulation along with the pulse width modulation in order to extend the range over which amplitude modulation is reversibly encoded within the signal.

In an alternative embodiment, data provided to the transmitter 300 includes data relating to a RF frequency to be transmitted, the phase information for the modulated signal, and amplitude information for the signal to be generated, which is to be decomposed into 'modulation' and the desired RF level, and/or data that describes the modulation scheme and data to be transmitted.

Figure 3B:
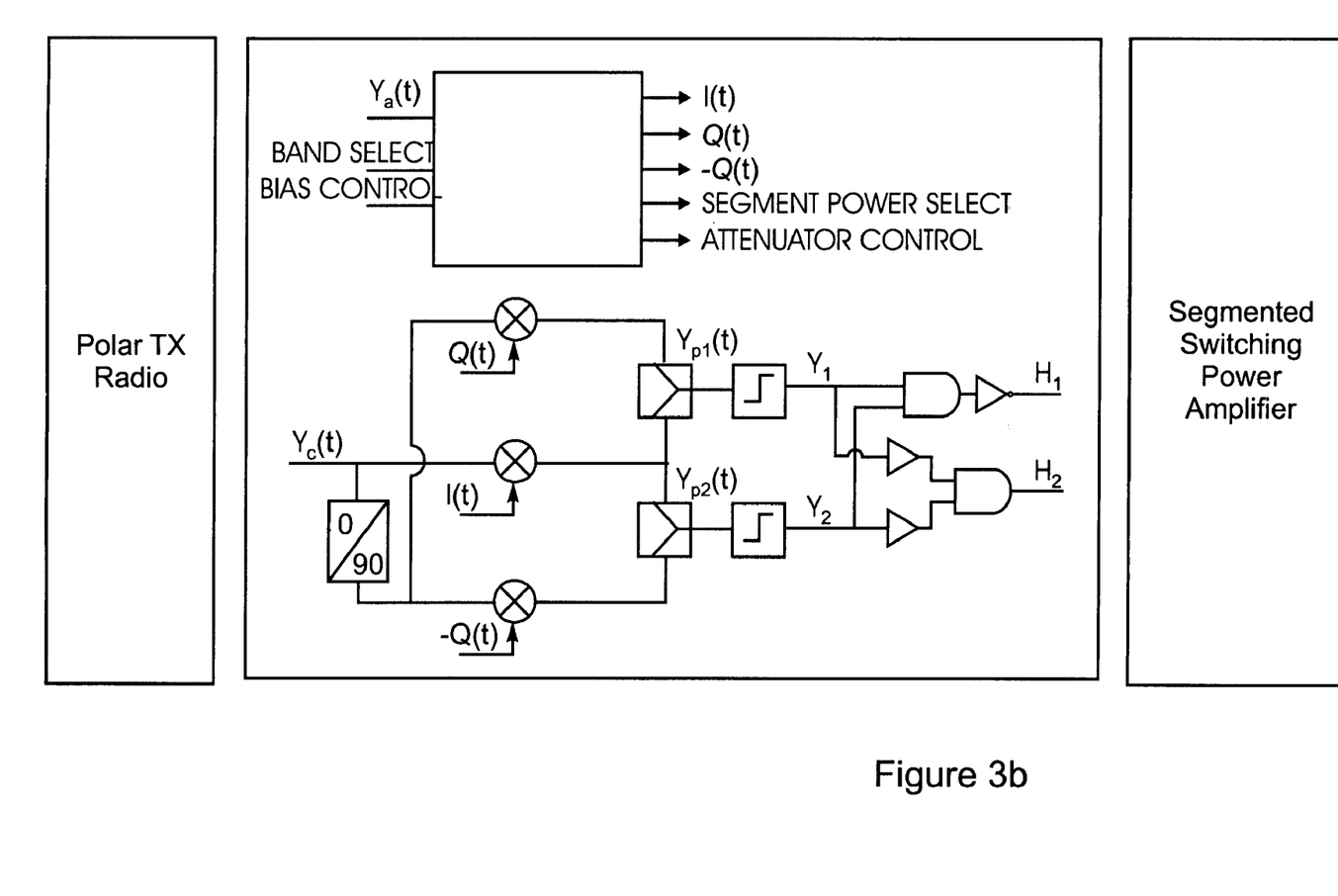
FIG. 3B illustrates an embodiment of the signal processing block of FIG. 3A

Referring to FIG. 3B, shown is the contents of a signal processor block according to the invention. The input signal $y_c(t)$ is mixed with the signal I(t) and the signal is mixed 90 degrees out of phase with the signal Q(t) and −Q(t) respectively. The resulting signals are combined in accordance with the combiner shown for resulting in the first and second digital signals, $H_1$ and $H_2$. The signal $y_a(t)$ is used to determine I(t), Q(t) and the amplification switching to support numerous power levels of the switching power amplifier.

Figure 4:
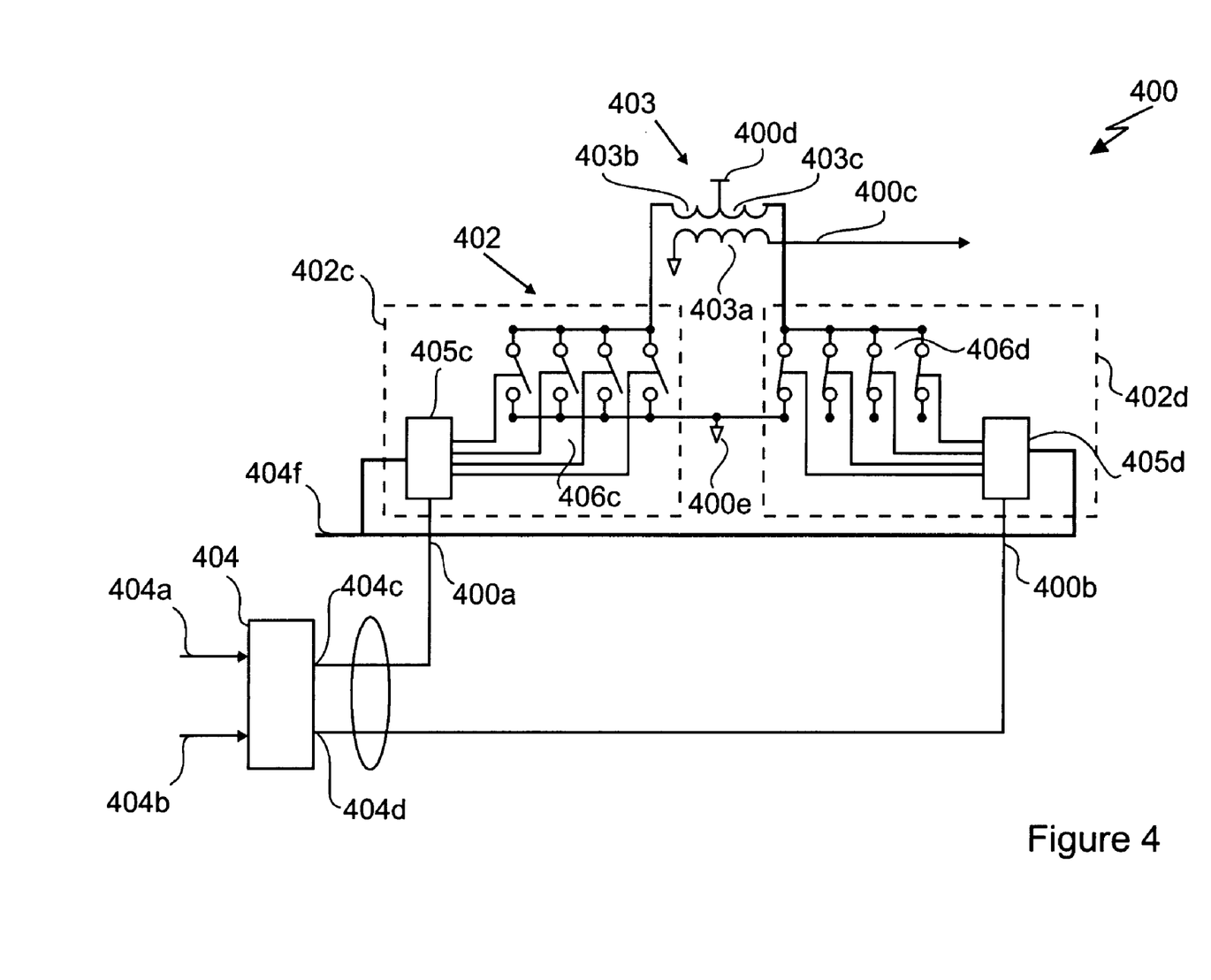
FIG. 4 illustrates a differential amplifier architecture, in the form of a transmitter, in accordance with another embodiment of the invention; and, FIG. 5 illustrates a polar signal processing block.

FIG. 4 illustrates a differential amplifier architecture 400, in the form of a transmitter, in accordance with another embodiment of the invention. An output stage 402 is provided in the form of a half H-bridge circuit that is disposed between first and second supply voltage ports, 400d and 400e. The half H-bridge circuit 402 is formed from two circuit branches. A first circuit branches has a first end thereof starting at a center tap 403c of a primary winding 403b of a transformer 403. A first end of the primary winding 403b is coupled with a first side of a first low side driver circuit 402c with a second side thereof further coupled with the second supply voltage port 400e, terminating the first circuit branch. A second circuit branch has a first end thereof starting at the center tap 403c of the primary winding 403b of a transformer 403. A second end of the primary winding 403b, opposite the first end of the primary winding, is coupled with a first side of a second low side driver circuit 402d with a second side thereof further coupled with the second supply voltage port 400e, terminating the second circuit branch. A secondary winding 403a of the transformer 403 is coupled with an external load (not shown) and used for providing of a high power modulated RF signal thereto.

The output stage 402 is provided with a first input port 400a and a second input port 400b. The first input port 400a is coupled with the first low side driver 402c and with the second low side driver 402d and the second input port is coupled with the second low side driver 402d. Within each of the drivers, 402c and 402d, arrays of switching circuits, 406c and 406d, as well as power control circuits, 405c and 405d, are respectively disposed. The array of switching circuits 406c is thus disposed between a first portion of the primary winding 403b and the second supply voltage port 400e. The array of switching circuits 406d is thus disposed between a second portion of the primary winding 403b and the second supply voltage port 400e.

Each of the array of switching circuits, 406c and 406d, is comprised of an array of binary-scaled switches. The power control circuit 405c and 405d, found in each low side driver, 402c and 402d is coupled with a same control port for receiving a power control signal for controlling the switching operation of each of the binary-scaled switches. The power control signal is in the form of a digital power control signal and is provided through a power control port 400f coupled with each of the power control circuits, 405c and 405d. The digital power control signal is used for gating the first and second digital signals provided to the output stage 402. Each array of the binary-scaled switches controls the current level provided to the primary winding 403b of the transformer 403 via one or more of the array of digitally selectable power flow paths. The gating, for a setting of the binary-scaled switches, determines the maximum power level that is transmittable using the transmitter 400 at a current instance. Optionally, the binary-scaled switches are similar to those described with reference to the first embodiment of the invention.

A signal processing circuit 404 is used for providing of first and second digital signals to the first and second output stage input ports 400a, 400b via first and second output ports, 404c and 404d, coupled thereto. The digital signals provided to the first and second output stage input ports 400a, 400b are similar to those digital signals provided from the signal-processing block 404. Referring to FIG. 2B, a pulse width of the digital signals 201 controls the amplitude modulation and an absolute phase 202 of the digital signals controls the phase modulation.

In order to provide signals to an amplifier architecture such as that shown in FIG. 3, a proposed a polar signal processing block is described herein for driving a power amplifier. For this amplifier the modulation is represented differently to the more usual AM/PM polar or I/Q components. The signal processing block provides required signal conversion and is covered in more detail in below. The PA topologies considered here are broadly based around the well known linear amplification using nonlinear components (LINC) technique, where the outputs of two or more nonlinear amplifiers are combined to form the desired modulated carrier signal. The PA input signal is first decomposed into two or more phase modulated carriers that contain the original AM/PM content. This allows non linear amplifiers with high power added efficiency (PAE), to be used because the input signals have a near unity peak to average power ratio. The PAE performance is preserved at lower output power levels through the additional use of segmentation. Each PA is composed of a number of parallel transistors, or segments, each scaled for operation at a particular power level increment. The signal processing block provides the control signals necessary to select the appropriate transistor for a given power level.

Whilst the LINC technique may be applied to a wide range of nonlinear PA classes, the main focus of the signal processing block will be to leverage the recent advances in CMOS technology—particularly CMOS line width and current drive which impact die size and cost. Therefore the signal processing block and the PA is preferably designed for implementation in CMOS. Modern cellular/WLAN/WPAN multimode radios will likely benefit by using high-density, advanced CMOS technology to leverage the computing power (MIPS) and lower the die size. Advanced CMOS allows for faster digital signal processing at lower levels of power consumption, and having an all CMOS signal processing/PA design provides for a clearer path future integration with multimode CMOS radio vendors and partners. The present embodiment is targeted to work with a radio transmitter based on a polar architecture. This is strategically aimed at the rising trend in polar loop transmitter designs for GSM/EDGE/WCDMA. It is also possible that there will be a similar trend for OFDM transmitters such as those used in WLAN 802.11a/g. The operation with OFDM is also strategically important because several future radio standards will be based on OFDM technology (ie. 802.11n, 802.16, 4G).

The CMOS PA in the embodiments of the invention presented herein use the CMOS transistor as an amplifier to be operated as a "switch". The classes of PA that are biased to operate this way are well known to offer the highest theoretical efficiencies.

The input signals provided to the signal processor block are typically standard signal and control outputs of a polar radio, including but not limited to phase modulated carrier, AM envelope and ramp signal, band select, and bias control. Of course, other input signals are also supported as long as they contain sufficient information for generating the AM/PM output signal. The signal processing block generates the corresponding modulated driver signals and power level and ramp control signals to be applied to, for example, the segmented switching PA.

Generating Modulated PA Driver Signals

The general representation of a modulated carrier signal is of the form:

$$y(t) = Re\{c(t)e^{j\omega_c t}\} \quad (1)$$

where the complex modulating signal, represented in its polar form: $c(t)=|c(t)|\arg[c(t)]=A(t)e^{j\Phi(t)}$, has a bandwidth much less than the carrier frequency $\omega_c$. The modulated signal outputs of a typical polar radio transmitter are the constant envelope phase modulated carrier signal:

$$y_c(t) = Re\{e^{j\phi(t)}e^{j\omega_c t}\} \quad (2)$$

and the amplitude envelope signal:

$$y_a(t) = A(t) \quad (3)$$

In the case of a burst mode transmitter it is assumed that this also contains the amplitude of the power up/down ramp as well as the amplitude content of the burst. The modulated carrier signal may be decomposed into two constant envelope phase modulated signals:

$$\begin{aligned}y(t) &= y_{p1}(t) + y_{p2}(t) \\ &= Re\{e^{j[\phi(t)+\alpha(t)]}e^{j\omega_c t}\} + Re\{e^{j[\phi(t)-\alpha(t)]}e^{j\omega_c t}\}\end{aligned} \quad (4)$$

where the amplitude modulation content is contained in $$\alpha(t) = \arccos\left[\frac{A(t)}{2}\right] \quad (5)$$

The carrier signals, $y_{p1}(t)$ and $y_{p2}(t)$, are in the correct format to drive some types of LINC PA's. However to drive the amplifiers as a switch they must be converted to binary level signals. Therefore $y_{p1}(t)$ and $y_{p2}(t)$ are first hard limited to form two phase modulated binary level signals $Y_1$ and $Y_2$. These signals are in the correct form to drive a LINC amplifier of the form shown in FIG. 2 although they need to both pass through a logical invertor to account for the switch also behaving as an invertor.

The signal processing block realizes the signals using the phase rotation properties of a vector modulator to modulate the amplitude information contained in the complex phasors $e^{\pm j\alpha(t)}$ onto the phase modulated carrier $y_c(t)$:

$$\begin{aligned}y_{p1}(t) &= Re\{e^{j[\alpha(t)]}e^{j\omega_c t+\phi(t)}\} \\ &= Re\left\{\left[\cos\left\{\arccos\frac{|c(t)|}{2}\right\} + j\sin\left\{\arccos\frac{|c(t)|}{2}\right\}\right]e^{j\omega_c t+\phi(t)}\right\} \\ &= Re\left\{\frac{1}{2}\left[|c(t)| + j\sqrt{4-|c(t)|^2}\right]e^{j\omega_c t+\phi(t)}\right\} \\ &= Re\{[I(t) + jQ(t)]e^{j\omega_c t+\phi(t)}\}\end{aligned} \quad (5)$$

and similarly:

$$y_{p2}(t) = Re\{[I(t) - jQ(t)]e^{j\omega_c t+\phi(t)}\} \quad (6)$$

Figure 5:
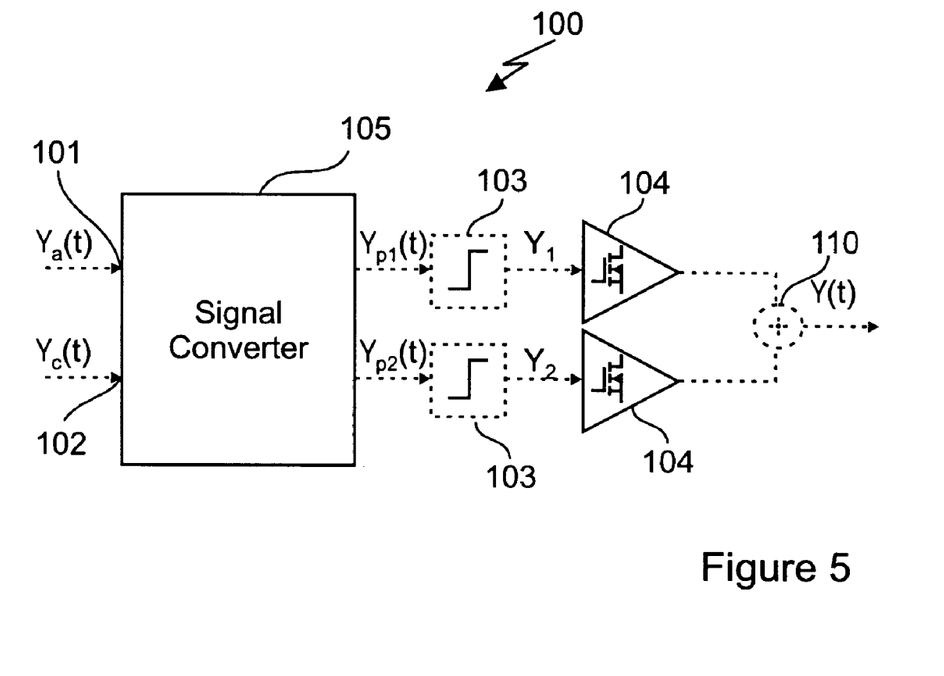

The above equations show that the two vector modulation operations are combinable by using the same in-phase signal and by noting that the two quadrature signals are related by a factor of $-1$. Also, the in phase signal is directly related to the amplitude modulation envelope. The signal processing block diagram architecture is shown in FIG. 5.

Power Level and Ramp Control of the Segmented PA

The signal processor provides power control signals to the PA for setting the transmit power level and for power ramp on/off. The processor ensures that the PA output power versus time characteristic has the desired ramp shape so as to not violate any relevant switching transient and spectral mask requirements as determined by standards organizations and regulatory bodies. Additionally the signal processor ensures that the PA is adequately disabled so that output power is sufficiently blanked between bursts.

Optionally, most of the PA power is controlled in a discrete fashion by enabling the various segments. This method of power control by itself is likely to be insufficient due to the likely coarse quantization of the transistor segments in setting output power. This is particularly true for transferring the desired power ramp on/off characteristic. Optionally, the signal processing block also controls the attenuator within the PA and provides control of the modulated signal phasors—adjusting $\alpha$—if necessary to provide a more continuous power control as required.

Support for Closed Loop Polar Transmitters

At the present time there are a number of polar transmitters in design for GSM/EDGE applications. Some architectures use open loop predistortion control to account for the AM/PM modulation transfer distortions largely dominated by the PA, whilst other approaches use a closed loop extending from within the polar radio to the matched PA output to provide correction.

With the above noted architecture, closed loop designs may be obviated for future designs, because if the open loop approach is found to provide an acceptable level of performance, then it will also result in a more cost effective design. That said, the signal processing block is able to operate in closed loop and open loop polar radio architectures.

Signal Processing for Predistortion Correction

The signal processing block is also able to supply a predistortion correction of the AM transfer characteristic of the PA. A correction of the PM component is optionally accommodated with some modification to the vector modulator architecture.

The above noted architecture lends itself very well to small geometry CMOS integration. All of the high speed logic functions are very simple whilst the most computationally intensive digital signal processing operations are performed on baseband signals within the modulation bandwidth.

The architecture is implementable in an almost "all digital" form apart from the input vector modulator. Several previous LINC PA interface circuits have been largely analogue/RF in nature. There have been some examples in the academic literature of utilizing bandpass delta sigma modulators to directly synthesize an RF carrier with combined PPM/PWM for the AM/PM components, but the shortcomings of these approaches is that the carrier has to be overclocked by at least a factor of 4 to enable the digital lowpass baseband to bandpass carrier realization. The resulting DSP clock would have to be of the order of 10 GHz to support designs for WCDMA carrier frequencies. The proposed architecture does not have that requirement as it makes direct use of the existing phase modulated RF carrier signal provided by the polar transmitter.

The present architecture achieves a good balance of analogue/digital signal processing.

Alternatively, the design is enabled in a more discrete form for demonstration platforms, and perhaps to interface to higher power PA's for base station applications.

Of course, though the above embodiments are described with reference to the H-bridge amplifier topology, the methodology applies to other amplifier topologies as well. This is apparent to those of skill in the art. Advantages and disadvantages in the choice of an amplifier topology for use with the invention are determinable through knowledge of those of skill in the art along with reasonable experimentation.

Though the embodiments described above each relate to phase and amplitude modulation within an AM/PM circuit, the invention is also applicable to amplitude modulation in isolation. Further, the invention is applicable to phase modulation in isolation. Further advantageously, the invention is applicable when phase modulation is already performed and wherein amplitude modulation is to be superimposed thereon.

In an embodiment, the phase modulation relates to a mean of the phase relationship between the first and second digital signals, the mean indicative of a pulse center when the first and second digital signals are combined. In an embodiment combining the first digital signal and the second digital signal is performed to form a digital drive signal having pulses, the pulse widths relating to the amplitude modulation for the RF carrier signal and the pulse positions relating to the phase modulation for the RF carrier signal. In an embodiment, a load is driven with the digital drive signal, the load for when driven resulting in a signal being amplitude and phase modulated in accordance with the at least an information signal.

In an embodiment wherein multiple transistors are used to scale an amplitude of the signals, such as that shown in FIG. 3a, a smallest transistor within a group is controllable in an analogue fashion for providing precise power control. In another embodiment an attenuator for attenuating the current provided from the group of transistors by an amount less than the current provided by the smallest transistor within the group, the attenuator providing analogue control over the output power.

Numerous other embodiments may be envisaged without departing from the spirit or scope of the invention.

What is claimed is:

1. A method of generating a modulated RF carrier signal comprising:
    receiving at least an information signal having information therein relating to an amplitude modulation for the RF carrier signal;
    providing a first digital signal; and,
    providing a second other digital signal having a phase relationship with the first digital signal relating to the amplitude modulation in accordance with the at least an information signal.

2. A method according to claim 1:
    wherein the at least an information signal comprises information therein relating to a phase modulation for the RF carrier signal; and
    wherein the phase relationship relates to the phase modulation in accordance with the at least an information signal.

3. A method according to claim 2, wherein the phase modulation relates to a mean of the phase relationship between the first and second digital signals, the mean indicative of a pulse center when the first and second digital signals are combined.

4. A method according to claim 3, comprising combining the first digital signal and the second digital signal to form a digital drive signal having pulses, the pulse widths relating to the amplitude modulation for the RF carrier signal and the pulse positions relating to the phase modulation for the RF carrier signal.

5. A method according to claim 4, comprising driving a load with the digital drive signal, the load for when driven resulting in a signal being amplitude and phase modulated in accordance with the at least an information signal.

6. A method according to claim 2, wherein the at least an information signal is received from a polar transmitter radio.

7. A method according to claim 1, comprising combining the first and second digital signals to form a digital drive signal having pulses, the pulse widths relating of the amplitude modulation for the RF carrier signal.

8. A method according to claim 7, wherein the step of combining is performed by summing the first digital signal and the second digital signal.

9. A method according to claim 7, wherein the step of combining is performed using a circuit having an H-bridge architecture.

10. A method according to claim 9, wherein the circuit having an H-bridge architecture comprises a switching power amplifier and wherein the first digital signal and the second digital signal are combined within a segmented switching power amplifier for providing power control, the first digital signal and the second digital signal for toggling segmented switching power amplifier transistors selectively into the on-state or off-state for providing power control.

11. A method according to claim 7, comprising driving a load with the digital drive signal, the load for when driven resulting in a signal being amplitude modulated in accordance with the at least an information signal.

12. A method according to claim 11, wherein the digital drive signal compensates for variations in the signal resulting from driving the load, the variations resulting from burst power ramp on/off effects in the amplitude modulated signal.

13. A method according to claim 11, wherein the load is an RF antenna and wherein application of the drive signal thereto results in a modulated signal radiated therefrom.

14. A method according to claim 11, wherein the load is an RF transmission cable.

15. A method according to claim 1, wherein at least one of the first digital signal and second digital signal includes information relating to a burst power ramp on/off characteristic of a load, the information for compensating for burst power ramp on/off effects in the amplitude modulated signal.

16. A method according to claim 1, wherein the steps of providing and using the first and second digital signals are performed within an integrated circuit manufactured using a CMOS process.

17. A method according to claim 1, wherein the first digital signal is a binary signal and wherein the second digital signal is a binary signal.

18. A method according to claim 1, comprising using the first digital signal and the second digital signal to control current magnitude and flow applied to a load for resulting in an amplitude modulated signal.

19. A method according to claim 1, wherein the at least an information signal includes a constant amplitude carrier signal.

20. A method according to claim 1, wherein the at least an information signal includes a signal indicative of AM modulation, the signal being a signal separate from a carrier signal for being modulated.

21. A method according to claim 1, wherein the first digital signal and the second digital signal are combined within a segmented switching power amplifier for providing power control, the first digital signal and the second digital signal for toggling segmented switching power amplifier transistors selectively into the on-state or off-state for providing power control.

22. A method according to claim 21, wherein the transistors are FETs and wherein the digital signal is applied to the gate absent a variation in potential applied to the source and drain.

23. A method according to claim 21, wherein the transistors are BJTs and wherein the digital signal is applied to the base absent a variation in potential applied to the collector and emitter.

24. A method according to claim 21, wherein the transistors are arranged in parallel in binary-scaled groups for providing power control, wherein each transistor provides a different amount of current, a sum of the current provided forming the total current.

25. A method according to claim 24, wherein a smallest transistor within a group is controllable in an analogue fashion for providing precise power control.

26. A method according to claim 24, comprising providing an attenuator for attenuating the current provided from the group of transistors by an amount less than the current provided by the smallest transistor within the group, the attenuator providing analogue control over the output power.

27. A modulation circuit comprising:
at least an input port for receiving at least an information signal having information therein relating to AM modulation;
a signal converter for providing a first digital signal relating to the at least an information signal and for providing a second digital signal relating to the at least an information signal and for being combined with the first digital signal, the first digital signal and the second digital signal phase modulated relative to the other; and,
a summing circuit for summing the first digital signal and the second digital signal to produce a digital drive signal for, when applied to a load, resulting in an amplitude modulated signal.

28. A modulation circuit according to claim 27, integrated within a single semiconductor die.

29. A modulation circuit according to claim 28, manufactured according to a CMOS process.

30. A modulation circuit according to claim 29, wherein the die comprises SiGe material.

31. A modulation circuit according to claim 27, comprising an amplifier comprising a binary scaled transistor array and wherein power level control is achieved by allowing a certain segment of the binary scaled transistor array to conduct current within the AM modulation circuit.

32. A modulation circuit according to claim 31, comprising an attenuator for providing attenuation, the attenuation on the order of the smallest transistor within the binary scaled transistor array, the attenuation providing analogue control over the current provided by the binary scaled transistor array.

33. A modulation circuit according to claim 27, wherein the phase modulation between the first digital signal and the second digital signal is for providing phase modulation within the digital drive signal.

34. A modulation circuit according to claim 27, wherein the combining circuit comprises a power amplifier circuit having an H-bridge architecture.

35. A modulation circuit according to claim 34, wherein the power amplifier circuit comprises a binary scaled transistor array.

36. A modulation circuit according to claim 27, wherein the amplitude modulation is a result of pulse widths within the digital drive signal.

37. A modulation circuit according to claim 36, wherein the digital drive signal is for driving a load including an RF radiator.

38. A modulation circuit according to claim 36, wherein the digital drive signal is for driving a load including an RF cable.

39. A modulation circuit according to claim 27, wherein the first digital signal and the second digital signal are generated in dependence upon a carrier signal having a known frequency.

40. A non-transitory computer readable storage medium having stored therein data, the data for when executed by a computer resulting in the steps of:
receiving at least an information signal having information therein relating to an amplitude modulation for the RF carrier signal;
providing a first digital signal; and,
providing a second other digital signal having a phase relationship with the first digital signal relating to the amplitude modulation in accordance with the at least an information signal.

41. A method of generating a modulated RF carrier signal comprising:
receiving at least an information signal having information therein relating to a phase modulation for the RF carrier signal;
providing a first digital signal;
providing a second other digital signal having a phase relationship with the first digital signal relating to the phase modulation in accordance with the at least an information signal.

42. A method according to claim 41, wherein the phase modulation relates to a mean of the phase relationship between the first and second digital signals, the mean indicative of a pulse center when the first and second digital signals are combined.

43. A method according to claim 41, comprising combining the first and second digital signals to form a digital drive signal having pulses, the pulse positions relating to the phase modulation for the RF carrier signal.

44. A method according to claim 43, comprising driving a load with the digital drive signal, the load for when driven resulting in a signal being phase modulated in accordance with the at least an information signal.

45. A method according to claim 44, wherein the load is an RF antenna and wherein application of the drive signal thereto results in a modulated signal radiated therefrom.

46. A method according to claim 44, wherein the load is an RF transmission cable.

47. A method according to claim 44, wherein the digital drive signal compensates for variations in the signal resulting from driving the load, the variations resulting from burst power ramp on/off effects in the amplitude modulated signal.

48. A modulation circuit comprising:
at least an input port for receiving at least an information signal having information therein relating to phase modulation;
a signal converter for providing a first digital signal relating to the at least an information signal and for providing a second digital signal relating to the at least an information signal and for being combined with the first digital signal, the first digital signal and the second digital signal phase modulated relative to the other; and,
a summing circuit for summing the first digital signal and the second digital signal to produce a digital drive signal for, when applied to a load, resulting in a phase modulated signal.

49. A modulation circuit according to claim 48, integrated within a single semiconductor die.

50. A modulation circuit according to claim 49, manufactured according to a CMOS process.

51. A modulation circuit according to claim 50, wherein the die comprises SiGe material.

52. A modulation circuit according to claim 48, comprising an amplifier comprising a binary scaled transistor array and wherein power level control is achieved by allowing a certain segment of the binary scaled transistor array to conduct current within the phase modulation circuit.

53. A modulation circuit according to claim 52, comprising an attenuator for providing attenuation, the attenuation on the order of the smallest transistor within the binary scaled transistor array, the attenuation providing analogue control over the power provided by the binary scaled transistor array.

54. A modulation circuit according to claim 48, wherein the combining circuit comprises a power amplifier circuit having an H-bridge architecture.

55. A modulation circuit according to claim 54, wherein the power amplifier circuit comprises a binary scaled transistor array.

56. A modulation circuit according to claim 48, wherein the digital drive signal is for driving a load including an RF radiator.

57. A modulation circuit according to claim 48, wherein the digital drive signal is for driving a load including an RF cable.

58. A modulation circuit according to claim 48, wherein the first digital signal and the second digital signal are generated in dependence upon a carrier signal having a known frequency.

59. A non-transitory computer readable storage medium having stored therein data, the data for when executed by a computer resulting in the steps of:
- receiving at least an information signal having information therein relating to a phase modulation for the RF carrier signal;
- providing a first digital signal;
- providing a second other digital signal having a phase relationship with the first digital signal relating to the phase modulation in accordance with the at least an information signal.

* * * * *